United States Patent
Donlin et al.

(10) Patent No.: US 7,788,625 B1
(45) Date of Patent: Aug. 31, 2010

(54) METHOD AND APPARATUS FOR PRECHARACTERIZING SYSTEMS FOR USE IN SYSTEM LEVEL DESIGN OF INTEGRATED CIRCUITS

(75) Inventors: Adam P. Donlin, Los Gatos, CA (US); Douglas M. Densmore, Berkeley, CA (US)

(73) Assignee: Xilinx, Inc., San Jose, CA (US)

( * ) Notice: Subject to any disclaimer, the term of this patent is extended or adjusted under 35 U.S.C. 154(b) by 182 days.

(21) Appl. No.: 11/106,324

(22) Filed: Apr. 14, 2005

(51) Int. Cl.
*G06F 17/50* (2006.01)

(52) U.S. Cl. ................... 716/18; 716/1; 716/6

(58) Field of Classification Search .............. 716/6, 716/16–18, 1
See application file for complete search history.

(56) References Cited

U.S. PATENT DOCUMENTS

| | | | | |
|---|---|---|---|---|
| 4,910,574 A | * | 3/1990 | Aipperspach et al. | 365/189.05 |
| 6,102,961 A | * | 8/2000 | Lee et al. | 716/1 |
| 6,154,803 A | * | 11/2000 | Pontius et al. | 710/310 |
| 6,347,395 B1 | * | 2/2002 | Payne et al. | 716/18 |
| 6,467,066 B2 | * | 10/2002 | Kusunoki | 716/4 |
| 6,467,074 B1 | * | 10/2002 | Katsioulas et al. | 716/17 |
| 6,604,227 B1 | * | 8/2003 | Foltin et al. | 716/6 |
| 6,609,233 B1 | * | 8/2003 | Foltin et al. | 716/6 |
| 6,611,948 B1 | * | 8/2003 | Tyler et al. | 716/6 |
| 6,742,165 B2 | * | 5/2004 | Lev et al. | 716/1 |
| 6,754,882 B1 | * | 6/2004 | Sanchez et al. | 716/16 |
| 6,785,876 B2 | * | 8/2004 | Takemura | 716/7 |
| 6,925,621 B2 | * | 8/2005 | Mielke et al. | 716/6 |
| 6,996,515 B1 | * | 2/2006 | Foltin et al. | 703/19 |
| 6,996,796 B2 | * | 2/2006 | Sanchez et al. | 716/16 |
| 7,124,376 B2 | * | 10/2006 | Zaidi et al. | 716/1 |
| 7,165,229 B1 | * | 1/2007 | Gathoo et al. | 716/1 |
| 7,203,918 B2 | * | 4/2007 | Wei et al. | 716/5 |
| 7,308,668 B2 | * | 12/2007 | Bueti et al. | 716/8 |
| 2002/0010902 A1 | * | 1/2002 | Chen et al. | 716/16 |
| 2002/0038401 A1 | * | 3/2002 | Zaidi et al. | 710/305 |
| 2003/0005396 A1 | * | 1/2003 | Chen et al. | 716/5 |
| 2003/0009730 A1 | * | 1/2003 | Chen et al. | 716/5 |
| 2003/0023934 A1 | * | 1/2003 | Lo et al. | 716/1 |
| 2003/0093764 A1 | * | 5/2003 | Devins et al. | 716/5 |
| 2003/0145290 A1 | * | 7/2003 | Devins et al. | 716/4 |
| 2003/0163798 A1 | * | 8/2003 | Hwang et al. | 716/16 |
| 2004/0022107 A1 | * | 2/2004 | Zaidi et al. | 365/202 |
| 2004/0210855 A1 | * | 10/2004 | Sanchez et al. | 716/1 |

(Continued)

OTHER PUBLICATIONS

Felice Balarin et al.; "Metropolis: An Integrated Electronic System Design Environment"; Published by IEEE Computer Society; Copyright 2003 IEEE; Apr. 2003; pp. 45-52.

(Continued)

*Primary Examiner*—Vuthe Siek
*Assistant Examiner*—Patrick Sandoval
(74) *Attorney, Agent, or Firm*—Marc Ascolese; Kevin T. Cuenot; Lois D. Cartier (57) ABSTRACT

Systems, methods, software, and techniques can be used to precharacterize a variety of prototype system designs. The prototype system designs can be defined at one or more levels of abstraction. The prototype designs are characterized using one or more electronic design automation tools to generate precharacterization data. Precharacterization data and associated prototype designs are used either directly or indirectly in the system level design process.

19 Claims, 4 Drawing Sheets

U.S. PATENT DOCUMENTS

| | | | | |
|---|---|---|---|---|
| 2004/0225992 | A1* | 11/2004 | Sanchez et al. | 716/16 |
| 2004/0236888 | A1* | 11/2004 | Dieffenderfer et al. | 710/112 |
| 2004/0255152 | A1* | 12/2004 | Kanamori et al. | 713/201 |
| 2005/0055592 | A1* | 3/2005 | Velasco et al. | 713/322 |
| 2005/0144586 | A1* | 6/2005 | Shieh et al. | 717/100 |
| 2005/0183045 | A1* | 8/2005 | Hwang et al. | 716/1 |
| 2005/0289268 | A1* | 12/2005 | Miller | 710/110 |
| 2006/0179192 | A1* | 8/2006 | Ganasan et al. | 710/110 |
| 2007/0006108 | A1* | 1/2007 | Bueti et al. | 716/8 |
| 2007/0186198 | A1* | 8/2007 | Lindberg et al. | 716/6 |
| 2007/0294658 | A1* | 12/2007 | Huang et al. | 716/18 |

OTHER PUBLICATIONS

J. A. Darringer et al.; "Early Analysis Tools for System-on-a-Chip Design"; IBM J. Res & Dev., vol. 46, No. 6; Nov. 2002; Copyright 2002 IBM; pp. 691-707.

IBM; "The CoreConnect Bus Architecture"; Copyright International Business Machines Corporation, 1999; downloaded from http://www.chips.ibm.com/products/coreconnect; pp. 1-8.

* cited by examiner

METHOD AND APPARATUS FOR PRECHARACTERIZING SYSTEMS FOR USE IN SYSTEM LEVEL DESIGN OF INTEGRATED CIRCUITS

TECHNICAL FIELD

The present invention relates to techniques for system level design of integrated circuits.

BACKGROUND

As integrated circuit technology continues to advance, system-level designers are finding that in many cases they can implement most or all of a particular system on a single integrated circuit. For example, numerous different functional blocks along with peripherals formerly attached to a processor at the card level are integrated onto the same die as the processor. Thus, a great deal of effort has been put into the development of system-on-chip (SoC) design methodologies, architectures, design tools, and fabrication techniques. Since SoCs are integrated circuits that combine the major functional elements of a complete end-product into a single chip using intellectual property (IP) blocks, they enable products with a broad and growing diversity of applications (e.g., communication networks, storage networks, set-top boxes, games, embedded devices, etc.) to be realized with higher performance and lower cost.

Many SoC solutions used in applications today are designed as custom integrated circuits, each with its own internal architecture and perhaps specialized software. Logical units within such an integrated circuit are often difficult to extract and reuse in different applications. Consequently, the same function is often redesigned from one application to the next. Consequently, to promote efficient SoC design and reuse, a variety of strategies are used. Since a typical SoC contains numerous functional blocks representing a very large number of logic gates, such designs can be realized through a macro-based approach targeting one or more specific hardware platforms, e.g., specific field programmable gate arrays (FPGAs), or specialized IP core libraries designed to be easily implemented in existing semiconductor fabrication processes. Macro-based design provides numerous benefits during logic entry and verification, and greatly facilitates IP reuse. From generic I/O ports to complex memory controllers and processor cores, each SoC typically uses many of these common macros.

While SoC design offers many advantages, there are still the familiar challenges of designing a complex system, now on a chip. Even with the benefit of a core library, today's SoC designers still have many options available, and making the right choices can be difficult. For example, desired hardware components have to be selected, functions have to be allocated to various hardware and software components, and optimal interconnection schemes need to be selected. All of this is performed while considering functional, performance, and cost constraints. Thus, in addition to addressing conventional integrated circuit design issues, SoC designers must also address issues traditionally handled by a system designer.

In general, system level design tools enable designers to model digital systems at levels of abstraction higher than that currently used in tool flows for digital design, e.g., register transfer level (RTL) hardware description languages (HDLs). Through successive refinements and analyses, designers use these tools to reduce the abstract system model to an actual RTL implementation. System level design tools and methods are growing in relevance to users of FPGA target systems, but to date, most of the research and development in system level design has been focused on ASIC or ASIC-like techniques for creating complex SoC designs.

Since many SoC designers rely on RTL system description and design flow tools for system implementation and analysis, a detailed design specification may be required at the outset of a design project to make important system level design determinations such as: which system functions should be implemented in hardware and which should be implemented in software, which processor core should be used, what system-wide operation constraints exist (e.g., interrupt latency, bus utilization, etc.), and can various budgets (circuit area, power consumption, etc.) be met. For example, a designer using an RTL system specification would typically need to identify all registers or memory elements, their timing conditions, and conditions under which data is transferred among them. Thus, obtaining the necessary design specification for making important system level design determinations can require almost as much effort as implementing the SoC itself.

Therefore, tools are needed to analyze higher-level representations of SoC designs early in the design process. Since rapid and accurate performance analysis is a design task that should be supported by system level design tools, it is desirable to have improved system level design tools that integrate accurate physical cost data into the system level design flow and make that data available (directly or indirectly) to designers in a useful manner. Moreover, the integration of such cost data into the design tool should not significantly hamper the designer's ability to express their system, tool speed, tool accuracy, or tool efficiency.

SUMMARY

The invention discloses techniques to precharacterize a variety of prototype system designs. The prototype system designs can be defined at one or more levels of abstraction. The prototype designs are characterized using one or more electronic design automation tools to generate precharacterization data. Precharacterization data and associated prototype designs are used either directly or indirectly in the system level design process.

Accordingly, one aspect of the present invention provides a method. A design for a prototype system-on-chip is defined. The design for the prototype system-on-chip is analyzed using at least one electronic design automation (EDA) tool. Data from results of the analyzing the design is extracted. The data describes at least one characteristic of the design for the prototype system-on-chip.

Another aspect of the present invention provides a system including a memory, a processor coupled to the memory, and a system level design tool. At least a portion of the system level design tool is encoded as instructions stored in the memory and executable on the processor. The system level design tool is configured to provide a plurality of different designs for prototype systems-on-chip. Each of the plurality of designs for prototype systems-on-chip is based on a plurality of fundamental system components. The system level design tool is also configured to access at least one of data resulting from analysis of the plurality of different designs for prototype systems-on-chip, and an expression that when evaluated uses at least a portion of the data resulting from analysis of the plurality of different designs for prototype systems-on-chip.

Another aspect of the present invention provides an apparatus including a means for defining a design for a prototype system-on-chip; a means for analyzing the design for the prototype system-on-chip using at least one electronic design automation (EDA) tool; and a means for extracting data from results from the means for analyzing the design, wherein the data describes at least one characteristic of the design for the prototype system-on-chip.

The foregoing is a summary and thus contains, by necessity, simplifications, generalizations and omissions of detail; consequently, those skilled in the art will appreciate that the summary is illustrative only and is not intended to be in any way limiting. As will also be apparent to one skilled in the art, the operations disclosed herein may be implemented in a number of ways, and such changes and modifications may be made without departing from this invention and its broader aspects. Other aspects, inventive features, and advantages of the present invention, as defined solely by the claims, will become apparent in the non-limiting detailed description set forth below.

BRIEF DESCRIPTION OF THE DRAWINGS

A more complete understanding of the present invention and advantages thereof may be acquired by referring to the following description and the accompanying drawings, in which like reference numbers indicate like features.

DETAILED DESCRIPTION

The following sets forth a detailed description of at least the best contemplated mode for carrying out the one or more devices and/or processes described herein. The description is intended to be illustrative and should not be taken to be limiting.

Figure 1:
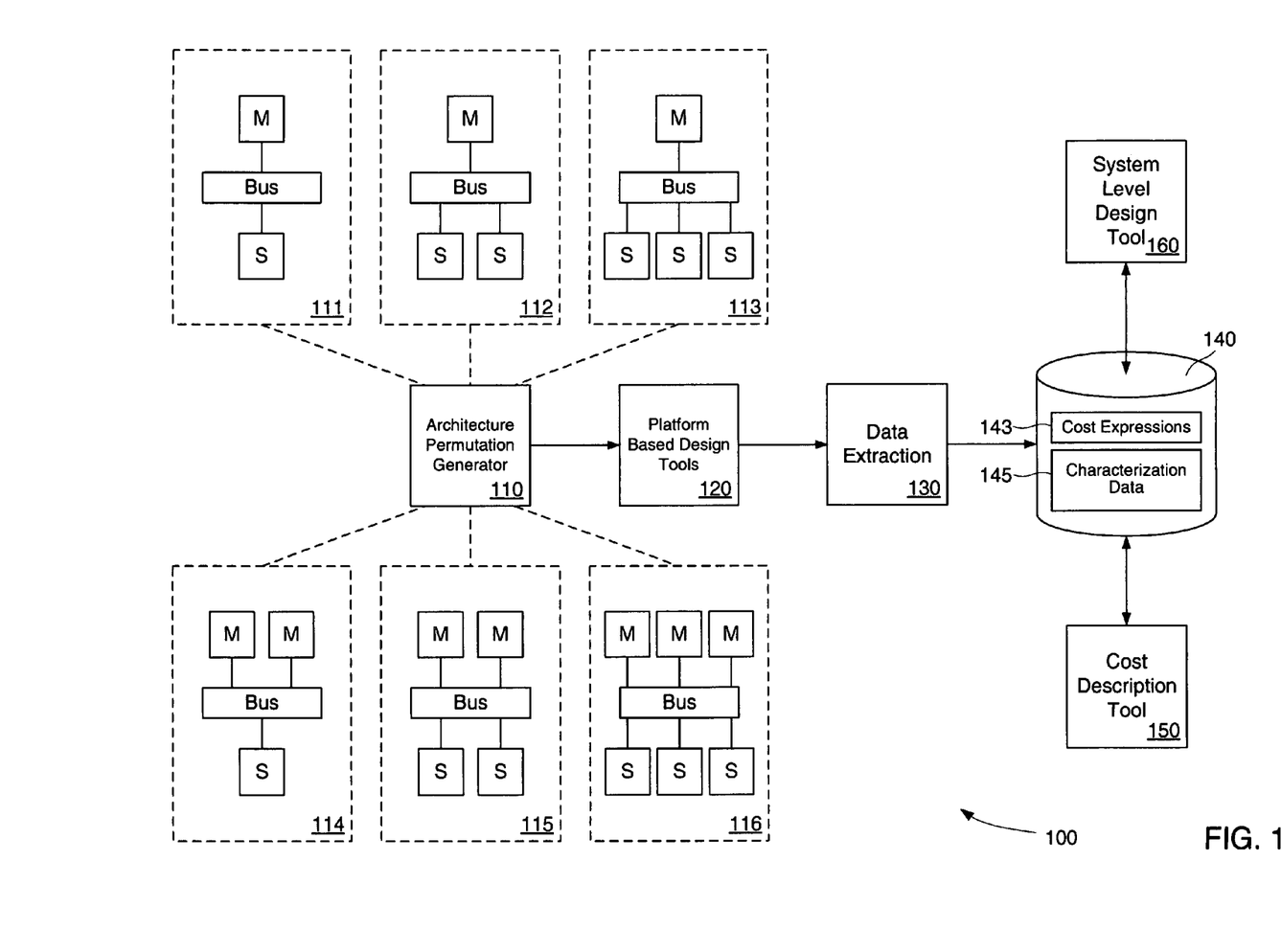
FIG. 1 is a simplified block diagram illustrating a precharacterizing system for use in system level design of integrated circuits.

FIG. 1 illustrates a simplified block diagram of a precharacterizing system for use in system level design of integrated circuits of one embodiment of the present invention. Precharacterization system 100 uses existing integrated circuit design tools to precharacterize the performance of one or more prototype or synthetic SoC systems. The data resulting from the system precharacterization can then be used in the design and development of a specific SoC implementation on a target device platform such as an FPGA. Moreover, the precharacterization of each prototype design typically happens only once for each FPGA architecture and speed grade because the data can be reused.

Since the exact SoC architecture that will ultimately be used in a final application cannot be precharacterized before it is designed, precharacterization system 100 focuses on a series of other system architectures whose organization and resource utilizations are suitably characteristic of some set of possible final SoC architectures. This approach utilizes the selection of some level of system abstraction. At one extreme (the least abstract), prototype systems can be assembled using the exact IP cores, macros, buses, etc. that are available to the designer for final implementation in the target device. While this approach can be used in principle, it may be impractical to implement because of the large number of available circuit blocks and the myriad ways in which those circuit blocks could be arranged. If however, the number of available circuit blocks is reasonably limited, or some other constraint is imposed on the set of possible prototype systems, it may be practical and desirable to precharacterize all possible permutations.

As illustrated in FIG. 1, a more typical approach is to select a higher level of abstraction for the assembly of prototype systems to be precharacterized. The precise level of abstraction used will generally depend on a number of factors. For example, prototype system architecture will depend on whether the systems being designed are structured or unstructured systems. In structured systems, SoC design follows a basic structure typically dictated by regular communication pathways on the integrated circuit such as well defined buses or a network-on-chip. Using the well-defined communication pathways, various logic blocks are arranged in the circuit and coupled to each other through the pathways. In a typical unstructured system, functional blocks interact directly with each other, perhaps through intermediaries such as FIFOs or simple buffers. Whether the higher level abstraction for prototype systems is based on structured or unstructured designs is largely a function of the target device. In the examples discussed throughout this application, emphasis will be placed on structured SoC designs, but those having ordinary skill in the art will readily recognize that the tools and techniques described herein can be implemented using any model of system abstraction.

Of similar concern is the selection of the degree of component abstraction to be used. As noted above, the least abstract approach is to simply use actual IP block descriptions (e.g., RTL, netlists, HDL, etc) in the prototype systems. In one embodiment, fundamental system components, which include one or more elements or blocks from the set of IPs available to the system designer, can be used to describe a prototype system. In other embodiments, more abstract descriptions of system components are used.

To implement such abstract descriptions, basic "black box" devices and communication pathways can be described using appropriate tools (e.g., HDLs, state-diagram capture programs, etc.). Such logic blocks will typically specify the minimal communication and logic properties of various blocks needed to simulate block functions. Various different blocks can be defined by type (e.g., processor core, peripheral, memory, bus, etc.), size, data throughput, and the like. Additionally, the level of abstraction can be driven by the library of available IP blocks. For example, if an IP library has numerous different peripheral blocks, it may be desirable to define several different prototype peripheral blocks, e.g., a small block, a medium block, and a large block. The IP library may be simple enough that it can be divided into master blocks and slave blocks. Alternately, there may be varying types of master and slave blocks, or abstract blocks more closely related to the block function, e.g., peripheral blocks, memory blocks, processor blocks, etc. In still another example, the IP library can be statistically analyzed to determine the most efficient or useful manner to abstract library components. Similarly, many models and modeling techniques currently used for design verification can be used as the basis for describing prototype systems to be precharacterized. In general, design permutations for precharacterization will be created by understanding the relationships between blocks at whatever level of abstraction is in use.

For example, transaction level modeling techniques associated with the use of a SystemC platform can be used. Transaction level modeling is a high-level approach to modeling systems where details of communications among system components are separated from the detail of the implementation of system components and communication architecture. It is an abstraction level at which first, the behavior of functional blocks (which may be part of one or more device abstraction models) in a given system can be separated from the communication, and second, the communication portion is described in terms of sending of transactions between an initiator of the communication, and the target. A further description of transaction level modeling is described in "Metropolis: An Integrated Electronic System Design Environment", by Felice Balarin, et. al., published by the IEEE Computer Society, April 2003, which is herein incorporated by reference.

In still other examples, device abstraction models, which include various I/O models, processor models, bus functional models, peripheral models, and memory device models for use with verification tools can form the basis for describing prototype systems. Thus in one embodiment, the components of the design of a prototype system-on-chip can be described using at least one device abstraction model, wherein the at least one device abstraction model comprises a I/O model, a processor model, a bus functional model, a peripheral model, a memory device model or any combination thereof. Bus-functional models simulate the bus cycles of the device or bus, providing a relatively complete model of the pins, cycles and on-chip-functions, without the need to model details of the system components, such as a processor's instruction core. The model typically provides a task or procedural interface to specify certain bus operations for a defined bus protocol. For microprocessors these transactions usually take the form of read and write operations on the bus. Bus functional models also simplify test vector generation and offer faster simulation performance than full-functional models typically provide.

Bus functional models can be particularly useful for modeling prototype SoCs because well developed bus functional models exist for buses commonly used in SoC implementations. Two of the most common communication architectures used in SoCs and ASICs are the CoreConnect™ bus architecture from IBM Corporation, and the Advanced Microcontroller Bus Architecture (AMBA™) from ARM Limited.

For example, the CoreConnect™ architecture provides a foundation for interconnecting various IP cores. Key elements of the architecture are a high-speed processor local bus (PLB), an on-chip peripheral bus (OPB), a PLB-OPB bridge, and a device control register (DCR) bus. The OPB is designed for easy connection of on-chip peripheral devices, and provides a common design point for various on-chip peripherals. The OPB is a synchronous bus (although it can use combinatorial/asynchronous arbitration) that is not intended to connect directly to a processor core. Instead, a processor core can access peripherals on this bus through an OPB bridge unit which is implemented as a separate core. However, in some implementations, the OPB can be connected directly to small processor cores such as the MicroBlaze core from Xilinx, Inc. of San Jose, Calif. The on-chip bus structure provides a link between the processor core and other peripherals which consist of PLB and OPB master and slave devices. The PLB is a high performance bus commonly used to access the main memory subsystem through bus interface units. A processor core typically has two PLB master ports, one port may serve the processor's instruction cache, while the other serves the processor's data cache. The PLB also typically supports a direct memory access (DMA) controller, which is a PLB master device used in data intensive applications to improve data transfer performance. Lower performance peripherals (such as OPB master, slave, and other internal peripherals) are attached to the OPB. A bridge can be provided between the PLB and OPB to enable data transfer by PLB masters to and from OPB slaves. The DCR bus is used primarily for accessing status and control registers within the various PLB and OPB masters and slaves, and is meant to off-load the PLB from the lower performance status and control read and write transfers.

Whatever system level abstraction model is used, the goal is to provide a series of other system architectures whose organization and resource utilizations are suitably characteristic of the final application's implementation. As shown in FIG. 1, various prototype system permutations (111-116) are generated by architecture permutation generator 110. The prototype systems are schematically illustrated in terms of master devices (M), slave devices (S), and an associated bus. Prototype systems 111-116 are merely illustrative, and more complicated permutations (e.g., more masters, more slaves, additional buses, bus components, bridges, etc.) can be included in the prototype systems generated by architecture permutation generator 110. Although the illustrated permutations are based on the number of masters and slaves, other system features can be permuted to generate prototype systems. Examples include: the types of blocks, interconnection properties, address space usage, bus arbitration modes, IP block parameters, physical layout of blocks, floorplan information, etc. The prototype systems are illustrated in a manner consistent with the CoreConnect™ architecture. Although the CoreConnect™ architecture will be used below to illustrate an example of a level of system abstraction used by the tools and techniques of the present application, numerous different abstraction models can be used. Such models include those previously described above, more detailed models such as the Virtual Socket Interface and Virtual Components from the Virtual Socket Interface Alliance (VSIA), combinations of various models, and the like.

Once the abstraction model is defined, architecture permutation generator 110 is used to generate one or more prototype systems that will be precharacterized. Architecture permutation generator 110 is typically implemented in software, and is configured with the basic building blocks of the architecture (e.g., masters, slaves, buses, etc.) as well as rules for the combination of those components. Further constraints can be imposed on the operation of architecture permutation generator 110 so as to narrow the scope of the prototype systems generated. For example, architecture permutation generator 110 can be configured to produce permutations having no more than a maximum number of masters, having no more than a maximum number of slaves, having no more than a maximum number of bus instantiations, and the like.

Similarly, architecture permutation generator 110 can be configured to avoid or discard certain permutations, such as permutations that are impractical or impossible to implement on the target device because of some physical characteristic of the device (e.g., number of gates available in an FPGA). In still other embodiments, architecture permutation generator 110 is configured with the library of available IP cores in mind, and/or with specific SoC applications in mind (e.g., network devices, multimedia devices, embedded controllers, etc.). Those having ordinary skill in the art will readily recognize that numerous different techniques can be used to generate permutations of the architecture and to regulate the types of permutations generated.

Each prototype system will be analyzed by one or more platform based design tools 120. The precise tool or tools used will generally depend on the type of precharacterization that is desired. In general, system performance is usually the criterion that drives SoC architecture selection. Other factors like power dissipation, target device resource utilization, and cost may also be dominant factors, but performance analysis is still typically needed to establish design tradeoffs. The platform based design tools 120 provide requisite data for classifying the various prototype systems and allowing a designer to address the broad range of performance questions about resource utilization (e.g., which or how many processors, memories, buses, and peripheral cores), data rates, and system throughput.

For example, if the circuit operation speed is a key parameter for the SoC designer, then the precharacterization should focus on the timing of signals arriving at, and being transmitted from various cells in the circuit. Thus, various different timing tools including static timing analysis tools, dynamic timing analysis tools, and timing simulation tools can serve as design tools 120. Similarly, tools for design floorplanning, block placement, signal routing, mapping to target devices, and power estimation can also be used. In general, any EDA tool of tools for generating precharacterization data useful to the system level designer can be implemented at 120. For any one prototype system, numerous different types of characterization can be performed. Moreover, many design tools and design flows allow for the batch processing of various designs. Thus, precharacterization system 100 can be implemented to generate and analyze one prototype system at a time, or to generate and analyze multiple prototype systems in some batch or parallel manner.

Since the design tools 120 typically provide resulting precharacterization data in a variety of different forms and at a variety of different levels of detail, data extraction module 130 is configured to extract desired precharacterization data and store the data in database 140. In one embodiment, data extraction module 130 is implemented as one or more scripts (e.g. written in Perl or Tcl) for extracting data from the various data files produced by design tools 120. In general, data extraction is as specific or generic as needed by the designer. Provided that the tools can fully analyze the permutations provided to them, data extraction can be as fine or coarse as the information available.

Database 140 is the repository for various types of characterization data 145 derived from the analysis of prototype systems performed by design tools 120. Numerous different database schemes can be used to implement database 140, from simple text files to sophisticated relational database management systems. In some embodiments, characterization data 145 includes data provided by IP core providers in addition to data explicitly derived using prototype systems and design tools. Since most SoCs are designed with specific software applications in mind, e.g., software that will be running on the SoC such as real-time operating systems, servers, browsers, etc., characterization data 145 can also include information about the effect such applications have on system performance. This data can be implicit in the characterization data for IP blocks (e.g., the analysis of the prototype systems including the IP blocks assumes certain applications are executing on the SoC), or it can be explicit (e.g., application A requires a certain number of processor cycles to run on the type of core included in the prototype design). The database can be used to approximate some application's run time, power consumption, etc. For example, the application modeled will use the database to see how many resources or services the application consumes. Some of the resources/services will be hardware and some will be software, and thus characterization data 145 can include data for a service handled by hardware or by software. Data related to software performance (e.g., cycle counts) can be gathered by an instruction set simulator for the target device.

Characterization data 145 can also include a description of the prototype system from which other characterization data is derived. This can be particularly useful where tools that use characterization data 145, e.g., system level design tool 160, have no specific information about the various prototype systems represented in the data. In alternate embodiments, characterization data associated with a particular prototype design does not include a description of the prototype system, but merely some label or identifier that can be used by other tools.

Database 140 also includes cost expressions 143. Cost expressions 143 can include equations, rules, etc. for using the characterization data. In general, cost expressions 143 can provide a bridge between the physical device data and the level of abstraction implemented in the system level design flow. The cost expressions reflect how a system level design tool should use the characterization data in the database, and can provide "translation" between the extracted data and what the system level design tool is trying to measure. For example, if the data for a particular prototype system describes a number of physical timing properties on a particular bus, cost expressions 143 can include one or more equations describing how to assemble the cost of, for example, a burst transaction in a way that is meaningful to the system level designer. In another example, cost expressions 143 are used to perform statistical analysis to further simplify use of the available data by a system designer. If the design tool is trying to measure execution time, but the extracted data is the number of nanoseconds (ns) for a bus transaction, the equations could simply indicate that the ns number should be multiplied by the number of transactions. Cost expressions 143 might also indicate that a particular transaction is actually a series of atomic transactions which have information in the database. In general, cost expressions 143 operate as an interface between the raw characterization data and the system level design tool. As shown in FIG. 1, cost expressions 143 are managed using a separate cost description tool 150. In many embodiments, the functionality of cost description tool 150 is integrated into some other software, such as system level design tool 160 or the database management system used to maintain database 140.

System level design tool 160 provides a variety of system level design functionality and utilizes characterization data 145 either directly, or indirectly via cost expressions or results generated using cost expressions. Although reference is made to system level design tool 160, the data gathered by system 100 can also be used by dedicated system level verification and dedicated performance analysis tools. Design tools such as system level design tool 160 typically utilize a vertical functional approach, beginning with a functional description of the complete system including both hardware and software parts. Each part is gradually refined into an implementation that usually involves an SoC containing one or more embedded processors, memory and other hardware units, and software that is compiled and run on the embedded processor(s).

In addition to this basic functionality, system level design tool 160 provides the designer with information about the precharacterized prototype systems. This information allows a designer to narrow the possible SoC implementations to one or more prototype systems that satisfies the designers needs Thus, with only a small amount of performance or "back-of-the-envelope" design information, a designer can examine only those prototype systems that satisfy some set of constraints. If more detailed analysis is required, when a system level designer simulates a model of their application, they will be able to select which of the prototype system characterizations they would like to use to annotate their model's execution. Indeed, the designer may use event traces to simultaneously evaluate the performance of their system in multiple prototype system configurations and then select the best overall architecture for the actual implementation of their architecture.

As will be understood by those having ordinary skill in the art, the above described functionality can be integrated into existing system level design tools or implemented in a specialized system level design tool. Moreover, the precise mechanics implemented for making use of the precharacterization data (e.g., graphical user interfaces, command line interfaces, etc.) can vary from implementation to implementation. Thus, system level design tool 160 can graphically present representations of various prototype systems (much like the representation in FIG. 1) or simply provide text descriptions of the system. Presentation of prototype systems can also be organized according to various characteristics. For example, prototype systems can be listed based solely on criteria such as performance (MIPS, throughput), resource consumption (gates; size, power), and the like. In an even simpler implementation, a user executes queries against database 140 searching for prototype systems with characteristics satisfying the user's constraints.

System level design tool 160 can include an SoC editor that serves as the primary user interface. The SoC editor is used for capturing a system level diagram, selecting the IP cores used, and defining interconnections among the SoC blocks. Before capturing the system level diagram, a designer can use the prototype system precharacterization functionality to evaluate possible design strategies, and even initially populate the system level design using a selected prototype design. Alternately, such an SoC editor would merely be an interface to a precharacterization analysis tool.

The various software entities (architecture permutation generator 110, design tools 120, data extraction module 130, etc.) are shown as separate software modules. These modules, and indeed any of the software modules described herein, can be variously combined into single software modules, implemented on separate computer systems, executed as separate threads on a single computer system, etc. Thus, the organization of the functional blocks and the hardware on which corresponding software is executed can be implemented in a variety of different ways as is well known in the art. In general, two or more of the various modules can execute on the same computer system, or on some combination of separate computer systems as desired. The types of computer systems on which such software can be implemented are described below in conjunction with FIG. 4.

Figure 2:
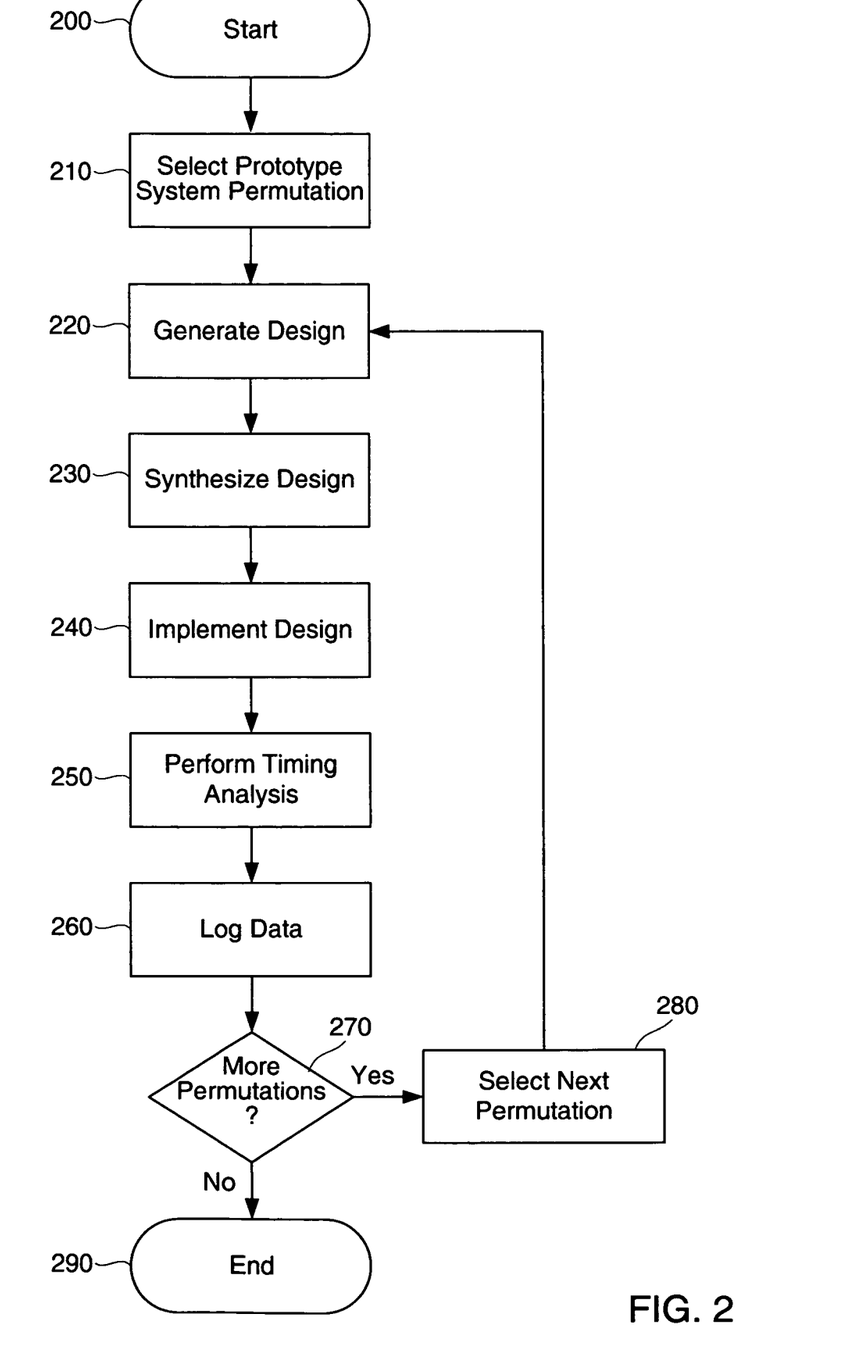
FIG. 2 is a simplified flow diagram illustrating some techniques of the present invention.

FIG. 2 is a simplified flow diagram illustrating one embodiment of the prototype system precharacterization process. The description of this flow diagram will emphasize example tools and devices from Xilinx, Inc., but those having ordinary skill in the art will recognize that numerous different target devices (FPGAs, ASICs, etc), IP core libraries, abstraction models, and EDA tools can be used to implement the techniques of FIG. 2.

Operation begins at 200 where the existence of one or more generated prototype system permutations is assumed. In this embodiment, emphasis is placed on prototype systems designed using bus functional models for one or more of the above described CoreConnect™ buses. Using the CoreConnect™ bus functional models provides an adequate level of abstraction, leverages existing bus functional models (provided by IBM and Xilinx), and is sufficiently specific to the final target devices, e.g., various Xilinx FPGAs can implement CoreConnect™. However, it should be emphasized that the use of bus functional (or similar) models is only one way in which designs can be abstracted, and numerous other schemes will be known to those having ordinary skill in the art. In general, the specification of system prototypes can be as simple as a graph that identifies nodes (e.g., processor, I/O, memory, etc) attached to a connection structure (e.g., bus, network-on-chip, etc). The resultant graph can then be converted to an appropriate format (e.g., the MHS file described below) for use in the precharacterization process. Various other techniques can be used to initially specify the prototype system.

As noted above, there are different bus functional models of different buses, and so, for example, the available prototype systems are described in terms of OPB and PLB bus functional model components. Each type of component is used to connect to its own respective bus, and for each bus there are different types of models. For example, there are OPB master, OPB slave and OPB monitor components. The same, or even more could exist for different buses and sometimes the functionality of various bus functional components is combined into a single one. Specific examples of components include:

OPB Device: The OPB device model may act as a master, as a slave, or as both. The master contains logic to automatically initiate bus transactions on the bus. The slave contains logic to respond to bus transactions based on an address decode operation. The model maintains an internal memory which can be initialized through the bus functional language and may be dynamically checked during simulation, or when all bus transactions have completed.

OPB Monitor: The OPB monitor is a model which connects to the OPB and continuously samples the bus signals. It checks for bus compliance or violations of the OPB architectural specifications and reports warnings and errors.

PLB Master: The PLB master model contains logic to automatically initiate bus transactions on the PLB bus. The model maintains an internal memory which can be initialized through the bus functional language and may be dynamically checked during simulation, or when all bus transactions have completed.

PLB Slave: The PLB slave contains logic to respond to bus transactions based on an address decode operation. The model maintains an internal memory which can be initialized through the bus functional language and may be dynamically checked during simulation, or when all bus transactions have completed.

PLB Monitor: The PLB monitor is a model which connects to the PLB and continuously samples the bus signals. It checks for bus compliance or violations of the PLB architectural specifications and reports warnings and errors.

Once a prototype system permutation is selected (210), operation transitions to 220 where an actual system design corresponding to the selected prototype system is generated. Again, using the example of the OPB and PLB bus functional models, the components required by the selected prototype system can be instantiated in a microprocessor hardware specification (MHS) file. This operation can be performed using a specialized tool, or an existing tool such as the Xilinx Platform Studio Package, which includes a set of CoreConnect™ bus functional models, a bus functional compiler, and various files tailored for use within Xilinx Platform Studio (XPS). The MHS file is a file format used by the XPS suite of tools, which provides an integrated environment for creating the software and hardware specification flows for embedded processor and SoC systems. An MHS file defines the configuration of the embedded processor system, and includes the following: bus architecture, peripherals, processor, connectivity, address space, and other design parameters. In this implementation, MHS stands as a neutral format on top of other description schemes such as VHDL and Verilog. In some embodiments, the design is already defined when step 210 is performed, and step 220 can be eliminated.

Next in 230, the design representing the prototype system is synthesized. Again using the XPS tool suite as an example, the MHS file can supplied to a synthesis tool such as Platform Generator (PlatGen) synthesis tool. PlatGen performs hardware generation using the MHS file. This constructs a representation of the SoC in the form of hardware netlists (e.g., HDL and implementation netlist files). In general, however, any suitable synthesis tool can be used. The synthesis tool transforms the input design specification into a netlist which specifies the components of the design and the connectivity (signals) between the components. In the case of HDL based circuit designs, the synthesis tool typically converts the HDL code into a gate level implementation, optimizing the logic automatically for circuit size and speed. In specifying the prototype design using the established bus functional models, existing HDL representations can be used by the synthesis tool.

Since the prototype system targets a particular FPGA device, the design is implemented in 240. In general, design implementation begins with the mapping or fitting of a logical design file to a specific device and is complete when the physical design is successfully routed and a bitstream is generated. The implementation process can use a variety of tools such as structure analysis tools, optimization tools, mapping tools, place-and-route tools, and bitstream generation tools (for programming the target device). For example, a place-and-route tool can generate physical implementation data based on the input netlist and derived structure information. The implementation data specify specific resources that must be built or configured on the target device in order to implement the circuit design. Exemplary implementation tools are present in the Xilinx Integrated Software Environment (ISE) design software suite.

In one embodiment, the end result of the design implementation step is a native circuit description (NCD) file (a physical database format for Xilinx software tools). The NCD design can represent various stages of implementation such as a mapped NCD design, a placed only NCD design, and a partial or completely placed and routed NCD design. This NCD file can then be used by various tools for precharacterization of the prototype system. In the case of FIG. 2, precharacterization takes the form of static timing analysis performed in step 250. Here, static timing analysis is performed by a tool such as the Timing Reporter and Circuit Evaluator (TRACE) provided by the Xilinx ISE software suite. TRACE uses the NCD file and an optional physical constraints file (PCF) based upon timing constraints specified by a user. Constraints can show such things as clock speed for input signals, the external timing relationship between two or more signals, absolute maximum delay on a design path, or a general timing requirement for a class of pins. In one embodiment, the set of specific precharacterization data derived in 250 is determined at least in part by constraints specified in the PCF file. TRACE is merely one example of a timing analysis tool, and those having ordinary skill in the art will readily recognize numerous alternate timing tools that can be used to accomplish operation 250. Moreover, as noted above in connection with FIG. 1, numerous different tools and techniques beyond timing analysis can be used to characterize the prototype system.

Once the timing analysis is performed, operation transitions to 260 where desired data is extracted from the timing reports and saved to a database such as database 140 of FIG. 1. In one embodiment, a specialized Tcl script parses the resulting timing reports and extracts data that will later be used by system level designers. In 270, it is determined whether additional architecture permutations exist to be analyzed. If so, operation transitions to 280 where the next architecture permutation is selected and then to 220 for further processing. If there are no further architecture permutations to characterize, operation terminates at 290.

Figure 3:
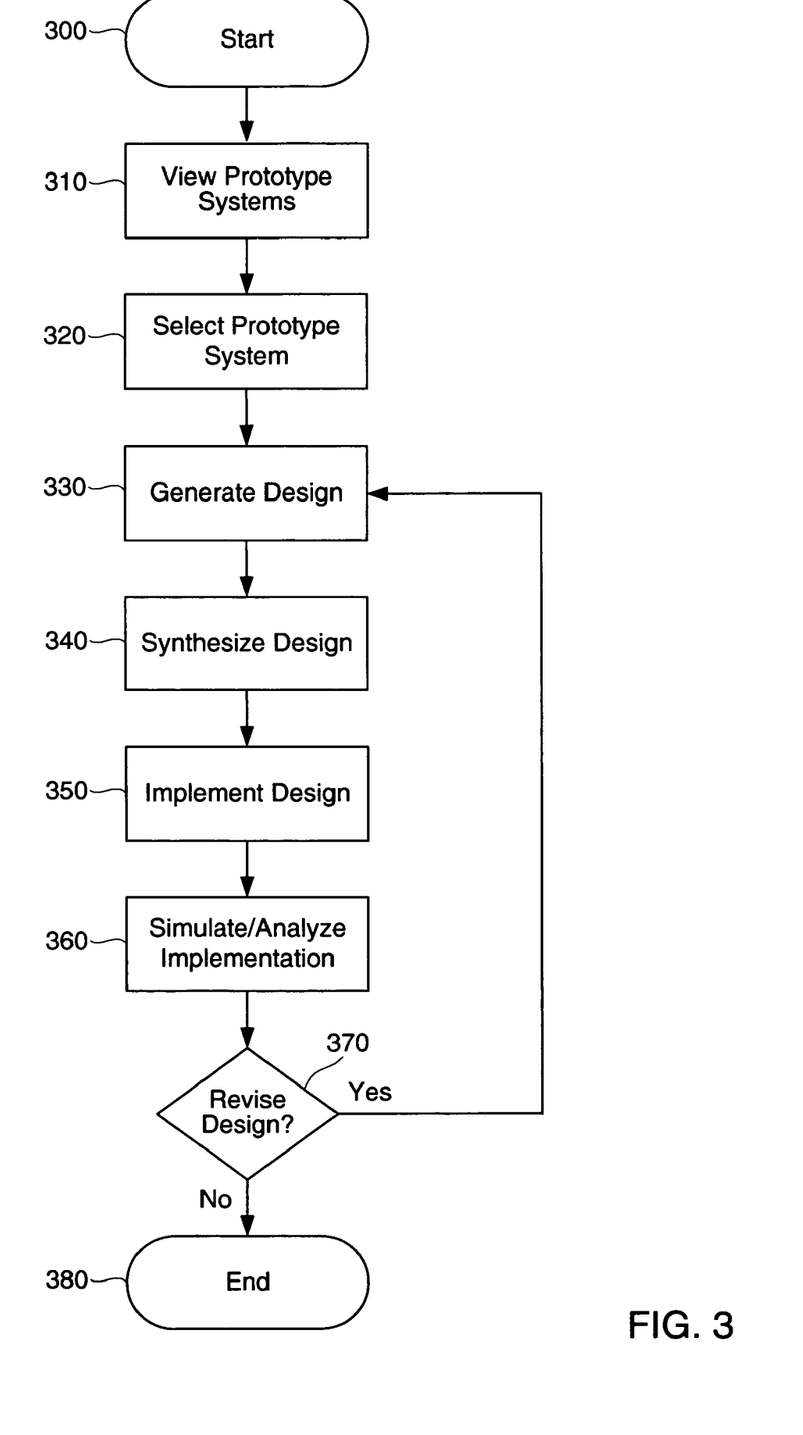
FIG. 3 is a simplified flow diagram illustrating additional techniques of the present invention.

FIG. 3 is a simplified flow diagram illustrating system level design techniques using the precharacterization data derived in, for example, the flow chart of FIG. 2. Operation begins at 300 where it is assumed that the user has access to information about one or more precharacterized prototype systems. In 310, one or more prototype systems are examined to determine a prototype system for use in design of an SoC. As noted above, the manner in which a user reviews prototype systems can vary from implementation to implementation, and can make use of various graphical user and command line interfaces. In some embodiments, a user views the prototype systems according to the characterization data about those systems. In other embodiments, a user views prototype systems characterization data indirectly, e.g., according to various cost expressions as evaluated using the characterization data. The user performs 310 with an eye toward selecting a representative system that has suitable characteristics. In still another embodiment, the user specifies, e.g., using an SoC editor tool, a prototype system that is desired, and the system level design tool matches (or closely matches) that prototype system to one or more precharacterized prototype systems.

Using whatever technique that is implemented for review of precharacterized prototype systems, a particular prototype system is selected at 320. This selection can involve actually picking a prototype system that will be used as the basis for the design. More commonly, a system designer will express their system design separately use the system level design tool to bind the timing models from one or more prototype systems in the characterization database to their existing system netlist. When the combination of the two is simulated (e.g., in 360) the designer is able to extract the performance data of their original system, keyed to the performance characteristics of the prototype system.

Thus, an initial design is generated (330). In cases where the initial design is based on the selected prototype system, some modification may be necessary to more closely conform to the user's requirements. In fact, a user might choose to abandon or change certain planned features of their design in favor of the selected prototype system. In other examples, generating the design includes modifying the prototype system to include features otherwise unavailable in the set of prototype systems and/or to more accurately represent the user's intended design. In still other embodiments, 330 involves the aforementioned binding of prototype system data to another design prepared by the designer (e.g., a netlist). The user can also use various other design tools such as, HDL editors, existing system level design tools, text editors, and the like, to modify the design and/or associate prototype system data with a specified design.

Once the design is sufficiently described, operation proceeds either directly to 360, or (as shown) to 340 where the design is synthesized. In some embodiments, the system level tool only resorts to invoking physical synthesis tools, place/route tools, etc. (e.g., steps 340 and 350) when the precharacterization database does not contain any data for a suitable prototype system or when modifications made in 330 necessitate additional synthesis/implementation. However, in other embodiments these operations are not needed because precharacterization of many system prototypes provides enough data so that additional synthesis/implementation cycles are avoided. Further implementation and synthesis may become more important towards the end of the set of design iterations, but the use of precharacterization data will in many cases reduce or eliminate the need for these operations in the majority of design iterations.

Step 340 is much like step 230 of FIG. 2, although it involves the use of a (presumably) more complete SoC design. As noted above, numerous different synthesis tools can be used to synthesize the design. One important part of the design synthesis process is to identify various circuit structures and logic elements in the circuit design and associate such structures and elements with pre-defined elements designed specifically for the target device. This process of recognizing or inferring device primitives and macros allows a circuit designer to take advantage of design elements optimized for the particular architecture without having to know detailed information about the best way to configure the basic logic blocks of the target device. As noted above, the synthesized design can also be, in some embodiments, implemented (350). This operation is similar to step 240 of FIG. 2, but may include additional steps to support post implementation steps.

A user then performs various verification simulations and analyses (360) to confirm that the design behaves in the desired manner and can be adequately implemented in the target device. This can include the use of such techniques as dynamic timing analysis, static timing analysis, timing simulation, behavioral simulation, and functional simulation. Based on the outcome of the operations performed in 360, a user decides (370) whether additional design modification is desired. If the design is to be revised, operation returns to 330, or in some cases 310 where a completely new prototype system is selected. If there are no further changes to the design, the process terminates at 390, and the target device can be programmed or fabricated as necessary.

In some embodiments, operations more closely related to a final design implementation, such as steps 340 and 350 are not performed. Instead, the simulation/analysis performed at 360 operates on the higher level design of the selected prototype system, perhaps with minor modification. Thus, in operation 360 a user can further examine the applicability of the prototype system and characterize it in ways not otherwise available from the precharacterization data. For example, a user can perform further simulations under varying operating conditions, using different test vectors, etc. Simulation can also be performed at a lower level of abstraction. Where a prototype system was selected based on a certain configuration of master and slave devices, further simulation can be performed after specifying the types of IP blocks (or even specific IP blocks) that are to represent each of the masters and slaves in the prototype system. Additionally, a user can simulate the performance of specific software that will ultimately execute on the SoC being designed. In general, any level of design analysis or simulation can be performed, and use of the precharacterization data need not immediately (or ever) lead to a synthesized design.

In some embodiments, various steps are repeated several times. For example, steps 310 and 320 can be iterated several times through several levels of abstraction. At each iteration, the prototype systems become more detailed, with the goal of converging on a prototype system as much like the final system being designed as possible. Moreover, each iteration can focus on different precharacterized aspects of the prototype systems. In other examples, iteration includes operations 310-370, or where 340 and 350 are eliminated (as discussed above) operations 310-330, 360 and 370. Thus, a prototype system is used to perform some analysis or simulation that in turn leads to the selection of another prototype system that, for example, is more appropriate or represents a new level of design refinement. In general, numerous variations of this system level design process can be implemented, all using the precharacterized systems described in the present application.

The flow charts of FIGS. 2 and 3 illustrate some of the many operational examples of precharacterized prototype SoC data collection and use disclosed in the present application. Those having ordinary skill in the art will readily recognize that certain steps or operations illustrated in FIGS. 2 and 3 can be eliminated or taken in an alternate order. Moreover, the methods described in FIGS. 2 and 3 are typically implemented as one or more software programs encoded in a computer readable medium as instructions executable on a processor. The computer readable medium can be any one of an electronic storage medium, a magnetic storage medium, or an optical storage medium. Separate instances of these programs can be executed on separate devices in keeping with the methods described above. Thus, although certain steps have been described as being performed by certain devices, software programs, processes, or entities, this need not be the case and a variety of alternative implementations will be understood by those having ordinary skill in the art.

Figure 4:
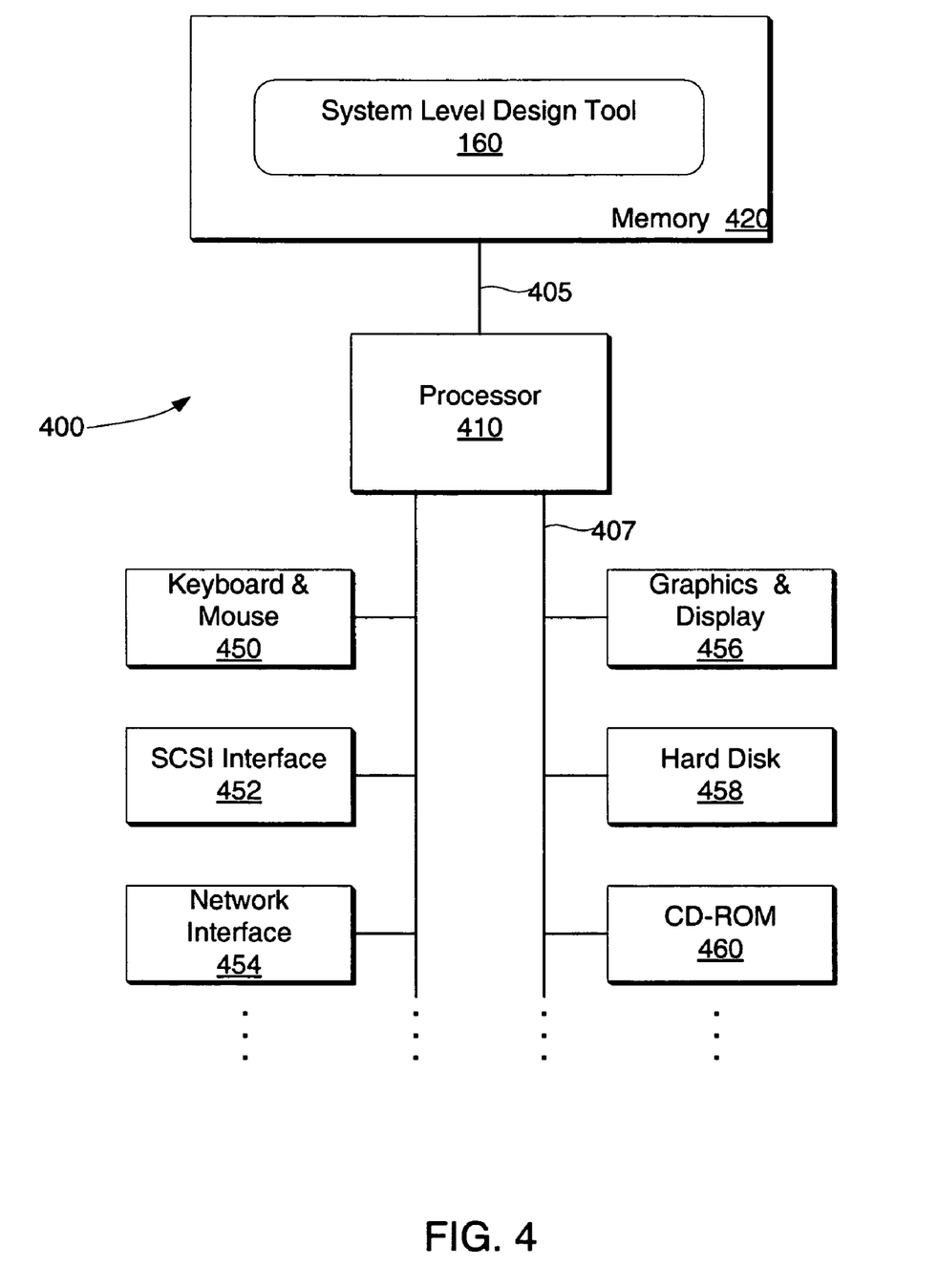
FIG. 4 is a block diagram of a computer system for implementing the techniques of the present invention.

FIG. 4 illustrates a block diagram of a computer system 400 for implementing the techniques for prototype system design precharacterization of the present invention. For example, computer system 400 is typically an EDA workstation used as part of the circuit design process. Computer system 400 includes a processor 410 and a memory 420 coupled together by communications bus 405. Processor 410 can be a single processor or a number of individual processors working together. Memory 420 is typically random access memory (RAM), or some other dynamic storage device, and is capable of storing instructions to be executed by the processor, e.g., system level design tool 160, architecture permutation generator 110, etc. Memory 420 is also used for storing temporary variables or other intermediate information during the execution of instructions by the processor 410.

Those having ordinary skill in the art will readily recognize that the techniques and methods discussed below can be implemented in software using a variety of computer languages, including, for example, traditional computer languages such as assembly language, Pascal, and C; object oriented languages such as C++, C#, and Java; and scripting languages such as Perl and Tcl/Tk. Additionally, software 160 can be provided to the computer system via a variety of computer readable media including electronic media (e.g., flash memory), magnetic storage media (e.g., hard disk 458, a floppy disk, etc.), optical storage media (e.g., CD-ROM 460), and communications media conveying signals encoding the instructions (e.g., via a network coupled to network interface 454).

Computer system 400 also includes devices such as keyboard & mouse 450, SCSI interface 452, network interface 454, graphics & display 456, hard disk 458, and CD-ROM 460, all of which are coupled to processor 410 by communications bus 407. It will be apparent to those having ordinary skill in the art that computer system 400 can also include numerous elements not shown in the figure, such as additional storage devices, communications devices, input devices, and output devices, as illustrated by the ellipsis shown.

The systems, methods, software, and techniques disclosed herein for precharacterizing prototype systems and using such data have emphasized applications targeting FPGA implementation. However, those having ordinary skill in the art will readily recognize that the same techniques can be used in system level design targeting ASICs and other integrated circuits. In general, the design and synthesis of any integrated circuit can make use of the systems, methods, software, and techniques described in the present application.

Although the present invention has been described with respect to a specific preferred embodiment thereof, various changes and modifications may be suggested to one skilled in the art and it is intended that the present invention encompass such changes and modifications that fall within the scope of the appended claims.

The invention claimed is:

1. A computer-implemented method comprising:
automatically generating a design for each of a plurality of prototype systems-on-chip, wherein each prototype system-on-chip has a different architecture comprising a unique combination of at least one master coupled to at least one slave through a bus, wherein each architecture is configured for implementation within a single chip and is determined by automatically generating permutations of at least one of a number of masters, a number of buses, or a number of slaves subject to permutation constraints limiting a total number of masters, slaves, and buses in each automatically generated architecture, wherein each design is a programmatic representation of a circuit;
analyzing the design for each of the plurality of prototype systems-on-chip using at least one electronic design automation (EDA) tool;
extracting data from results of the analyzing the design for each of the plurality of prototype systems-on-chip, wherein the data describes at least one characteristic of each design for the plurality of prototype systems-on-chip comprising bus transaction timing information;
storing the data for each of the plurality of designs for prototype systems-on-chip, the designs, and a description of the architecture for each of the plurality of prototype systems-on-chip within a memory as a selectable, prototype system-on-chip option;
selecting a prototype system-on-chip option from the plurality of prototype systems-on-chip options according to the stored data comprising bus transaction timing information; and
generating a user-design using the architecture of the selected prototype system-on-chip option, wherein the user-design comprises the unique combination of at least one master coupled to at least one slave through a bus as specified by the selected prototype system-on-chip option.

2. The method of claim 1 further comprising:
generating the plurality of prototype systems-on-chip by generating the different architectures, wherein each architecture comprises a unique master, bus, slave combination selected according to a constraint of a target device in which the user-design is to be implemented and, wherein each architecture is configured for implementation within a single chip.

3. The method of claim 1 wherein the generating the design for each of the plurality of prototype systems-on-chip further comprises:
using at least one device abstraction model to describe components of the design for the prototype system-on-chip.

4. The method of claim 3 wherein the at least one device abstraction model comprises at least one of an I/O model, a processor model, a bus functional model, a peripheral model, or a memory device model.

5. The method of claim 1 further comprising:
synthesizing the design for the selected prototype system-on-chip option using a design synthesis tool; and
implementing the design for the selected prototype system-on-chip option using a design implementation tool.

6. The method of claim 1 further comprising:
simulating a user design as each of at least two prototype system-on-chip options by binding timing models of the at least two prototype system-on-chip options to a netlist of the user design; and
wherein selecting a prototype system-on-chip comprises selecting one of the at least two prototype system-on-chip options according to performance data from the simulating.

7. The method of claim 1 wherein selecting a prototype system-on-chip comprises automatically matching a user specified prototype to one of the prototype system-on-chip options.

8. The method of claim 1 further comprising:
designing a system-on-chip using the data describing at least one characteristic of the design for the prototype system-on-chip.

9. The method of claim 1 encoded in a computer readable medium as instructions executable on a processor, the computer readable medium being one of an electronic storage medium, a magnetic storage medium, or an optical storage medium.

10. A system comprising:
a memory;
a processor coupled to the memory; and
a system level design tool, wherein at least a portion of the system level design tool is encoded as instructions stored in the memory and executable on the processor, and wherein the system level design tool:
provides a plurality of different designs for prototype systems-on-chip, wherein at least one of the plurality of designs for prototype system-on-chip is based on a device abstraction model for a bus and each prototype system-on-chip has an architecture comprising a unique master, slave, bus combination that is generated according to a constraint of a target device in which the designs for prototype systems-on-chip are to be implemented,
wherein each architecture is configured for implementation within a single chip and is determined by automatically permuting at least one of a number of masters, a number of buses, or a number of slaves subject to permutation constraints limiting the total number of masters, slaves, and buses in each automatically generated architecture.

11. The system of claim 10 wherein the system level design tool accesses at least one of data resulting from analysis of the plurality of different designs for prototype systems-on-chip comprising bus transaction timing information, and an expression that when evaluated uses at least a portion of the data resulting from analysis of the plurality of different designs for prototype systems-on-chip.

12. The system of claim 11 wherein the data resulting from analysis of the plurality of different designs for prototype systems-on-chip is obtained using at least one electronic design automation (EDA) tool.

13. The system of claim 10 wherein the device abstraction model comprises at least one of an I/O model, a processor model, a bus functional model, a peripheral model, or a memory device model.

14. The system of claim 10 wherein the system level design tool is further configured to perform
- simulating a user design as each of at least two designs for prototype systems-on-chip by binding timing models of the at least two designs for prototype systems-on-chip to a netlist of the user design; and
- selecting one of the at least two designs for prototype systems-on-chip according to performance data from the simulating.

15. The system of claim 10 wherein the system level design tool is further configured to:
- select a design for a prototype system-on-chip from the plurality of different designs for prototype systems-on-chip by automatically matching a user specified prototype to one of the designs for prototype systems-on-chip.

16. The system of claim 10 wherein the system level design tool further comprises:
- a user interface for selecting at least one of the plurality of different designs for prototype systems-on-chip.

17. The system of claim 10 wherein at least one of the plurality of different designs for prototype systems-on-chip is presented in conjunction with at least one characteristic of the at least one of the plurality of different designs, and wherein the at least one characteristic includes at least one of a performance characteristic, a power consumption characteristic, or a target device resource consumption characteristic.

18. An apparatus comprising:
- a means for automatically defining a plurality of prototype systems-on-chip, wherein each prototype system-on-chip has a different architecture comprising a unique combination of at least one master coupled to at least one slave through a bus, wherein each architecture is configured for implementation within a single chip and is determined by automatically generating permutations of at least one of a number of masters, a number of buses, or a number of slaves subject to permutation constraints limiting a total number of masters, slaves, and buses in each architecture;
- a means for analyzing each of the plurality of prototype systems-on-chip using at least one electronic design automation (EDA) tool;
- a means for extracting data from results from the means for analyzing each of the plurality of prototype systems-on-chip, wherein the data describes at least one characteristic of each prototype system-on-chip comprising bus transaction timing information;
- a means for generating a plurality of different designs for prototype systems-on-chip, wherein at least one of the plurality of designs for a prototype system-on-chip uses at least one device abstraction model for the bus;
- a means for simulating each of the plurality of different designs; and
- a means for selecting one of the plurality of different designs according to simulation results comprising bus transaction timing information.

19. The apparatus of claim 18 wherein the at least one characteristic of the design for the prototype system-on-chip further comprises at least one of a performance characteristic, a power consumption characteristic, and a target device resource consumption characteristic.

* * * * *